(12) United States Patent
Hirakata et al.

(10) Patent No.: US 6,936,228 B2
(45) Date of Patent: Aug. 30, 2005

(54) MANUFACTURING APPARATUS FOR CARBON NANOTUBE

(75) Inventors: Masaki Hirakata, Nakai-machi (JP);
Kentaro Kishi, Nakai-machi (JP);
Kazunori Anazawa, Nakai-machi (JP);
Hiroyuki Watanabe, Nakai-machi (JP);
Masaaki Shimizu, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 172 days.

(21) Appl. No.: 10/656,267

(22) Filed: Sep. 8, 2003

(65) Prior Publication Data
US 2004/0168906 A1 Sep. 2, 2004

(30) Foreign Application Priority Data
Feb. 27, 2003 (JP) .......................... 2003-51659

(51) Int. Cl.[7] .................................. B01J 19/12
(52) U.S. Cl. ..................... 422/186.21; 422/186.03; 422/186.04
(58) Field of Search ................. 422/186.03, 186.04, 422/186.21

(56) References Cited

U.S. PATENT DOCUMENTS 6,063,243 A * 5/2000 Zettl et al. ................. 204/164

2002/0179428 A1 * 12/2002 Anazawa et al. ........... 204/173
2003/0173206 A1 * 9/2003 Delaunay et al. ........... 204/164

OTHER PUBLICATIONS

A. Thess et al, "Crystalline Ropes of Metallic Carbon Nanotubes," *Science*, vol. 273, pp. 483–487, Jul. 1996.
K. Anazawa et al., "High–purity Carbon Nanotubes Synthesis Method by an Arc Discharging in Magnetic Field," *Applied Physics Letters*, vol. 81, No. 4, pp. 739–741, Jul. 2002.

* cited by examiner

*Primary Examiner*—Steven Versteeg
(74) *Attorney, Agent, or Firm*—Oliff & Berridge, PLC

(57) ABSTRACT

Provided is a manufacturing apparatus for a carbon nanotube including: at least two electrodes whose tips are opposed to each other; at least a power supply that applies a voltage between the two electrodes to generate discharge plasma in a discharge area between the two electrodes; and at least a plurality of magnets that generates, in a generation area of the discharge plasma, at least one of a magnetic field of multiple directions and a magnetic field having a component in parallel with a flowing direction of a discharge current, in which a thermal shield wall made of a non-magnetic material is disposed between the magnets and the generation area of the discharge plasma. Accordingly, an influence on the magnetic field due to the heat generated from the discharge plasma can be suppressed, and a high-purity carbon nanotube with excellent industrial efficiency can be stably manufactured.

16 Claims, 9 Drawing Sheets

MANUFACTURING APPARATUS FOR CARBON NANOTUBE

FIELD OF THE INVENTION AND RELATED ART STATEMENT

The present invention relates to a manufacturing apparatus for a carbon nanotube whose industrial availability has been attracting attention in recent years.

A material having a diameter of 1 $\mu$m or smaller which is finer than a carbon fiber is generally called a carbon nanotube and distinguished from the carbon fiber. However, there is no particularly definite boundary therebetween. By a narrow definition, the material whose hexagonal mesh carbon surface is substantially parallel to an axis is called a carbon nanotube, and even a variant of the carbon nanotube, around which amorphous carbon exists, is included in the carbon nanotube (note that the narrow definition is applied to the carbon nanotube according to the present invention).

In general, the narrowly-defined carbon nanotube is further classified into two types: a carbon nanotube having a structure with a single hexagon mesh tube (graphene sheet) is called a single wall nanotube (hereinafter, simply referred to as "SWNT"); and on the other hand, a carbon nanotube made of multilayer graphene sheets are called a multi-wall nanotube. The carbon nanotubes of these types each have an extremely finer diameter than that of the carbon fiber, a high Young's modulus, and a high electrical conductivity, thereby attracting attention as a new industrial material.

Thus, the carbon nanotube is a new material whose structural element is only carbon, and is mechanically extremely strong enough to exceed a Young's modulus of 1 TPa. In addition, electrons flowing through the carbon nanotube easily undergo ballistic transport, so that it is possible to cause a large quantity of current to flow through the carbon nanotube. Further, the carbon nanotube has a high aspect ratio, so that its application to a field electron emitting source is under way, and a light emitting element and a display which are capable of exhibiting high brightness are under development Furthermore, some SWNTs exhibit semiconductor characteristics, and are applied to experimental manufacture of a diode and a transistor. Therefore, applications of the SWNTs are especially desired in a field of functional materials and in a field of an electronic industry.

Conventionally, it has been known that fullerenes and carbon nanotubes can be manufactured by methods including resistance heating, plasma discharge such as arc discharge with a carbon rod as a raw material, laser ablation, and chemical vapor deposition (CVD) using acetylene gas. However, a mechanism of generating carbon nanotubes with those methods is controversial in various respects, and a detailed growth mechanism is not disclosed even now.

With regard to the manufacture of a carbon nanotube, various methods and improvements have been studied for the purpose of synthesis in a large quantity. The resistance heating which was devised in the early stage is a method of heating and vaporizing graphite by bringing tips of two pieces of graphite in contact with each other in a rare gas, and then applying a current of several tens to several hundreds of amperes. However, with this method, it is extremely difficult to obtain a few grams of sample, so that the method is hardly used now.

The arc discharge is a method of synthesizing fullerenes and carbon nanotubes by generating arc discharge in a rare gas such as He and Ar while using graphite rods as an anode and a cathode. The tip of the anode reaches a high temperature of approximately 4000° C. or more by arc plasma generated by the arc discharge, then the tip of the anode is vaporized, and a large quantity of carbon radicals and neutral particles are generated. The carbon radicals and neutral particles repeat collision in the plasma to further generate carbon radicals and ions, which become soot containing fullerenes and carbon nanotubes to be deposited around the cathode and the electrodes and on the inner wall of an apparatus. When the anode includes an Ni compound, a ferrous compound, or a rare earth compound, which acts as a catalyst, the SWNT can be synthesized efficiently.

The laser ablation is a method of irradiating a pulse YAG laser beam on a graphite target and generating high-density plasma on the surface of the graphite target to generate fullerenes and carbon nanotubes. The feature of the method is that a carbon nanotube having a relatively high purity can be obtained even at a high growth temperature exceeding 1000° C.

A technique for higher-purity synthesis of the SWNT for increasing the purity in the laser ablation is reported in A. Thess et. al, "SCIENCE", Vol. 273, p. 483–487. However, the laser ablation supplies only a small quantity of carbon nanotubes, and the efficiency is low, leading to a high cost of a carbon nanotube. In addition, the purity remains approximately 70 to 90%, and is not sufficiently high.

The chemical vapor deposition is a method of generating a carbon nanotube by a chemical decomposition reaction of a raw material gas, using an acetylene gas, a methane gas, or the like containing carbon as a raw material. The chemical vapor deposition depends on a chemical reaction occurring in a thermal decomposition process of a methane gas and the like serving as the raw material, thereby enabling the manufacture of a carbon nanotube having a high purity.

However, in the chemical vapor deposition, the growth rate of the carbon nanotube is extremely low, the efficiency is low, and industrial application is difficult. In addition, a structure of the manufactured carbon nanotube has more defects and is incomplete compared with that synthesized in the arc discharge and the laser ablation.

The use of a vertical furnace may enable continuous growth, thereby realizing a growth apparatus having a high production capability. However, in that case, the purity of the obtained carbon nanotube remains low.

Electrons, ions of carbon, radicals, and neutral particles in the arc plasma generated by the arc discharge repeat recollision, thereby generating complex chemical reactions, so that it is difficult to stably control the density and the kinetic energy of the carbon ions. Thus, a large amount of amorphous carbon particles, and graphite particles are generated simultaneously along with the fullerenes and the carbon nanotubes, and all of them exist in a mixed state as soot.

Thus, when the fullerenes and the carbon nanotubes are to be used for industrial application, it is necessary to purify and separate only the fullerenes and carbon nanotubes from the soot. Especially, the carbon nanotubes are not dissolved in a solvent, so that the purification is conducted by combining centrifugation, oxidation, filtering, and the like. However, the physical characteristics and chemical characteristics of the carbon nanotubes, and those of the amorphous carbon particles and the graphite particles, which are major impurities, are approximately the same, thereby making it difficult to remove the impurities completely. Thus, a high-purity carbon nanotube is obtained by repeating purification. It is also known that, in the purification process, alkali metals may remain due to the influence of surface active agent used as dispersing agent, the influence of the kinetic damage is extensive in the purification process, and a large quantity of defects develop in the carbon nanotubes.

To solve this problem, on the synthesis stage of the carbon nanotubes, synthesis technique for producing a high-purity carbon nanotube which includes as less impurities as possible, that is a carbon nanotube which does not include amorphous carbon particles and graphite particles is desired.

In the arc discharge and the laser ablation which exhibit small number of defects in the structure of the carbon nanotube, the length of the obtained carbon nanotubes varies, and it is impossible to adjust the shape. Therefore, when carbon nanotubes with a desired length are to be obtained, it is necessary to separate carbon nanotubes having a desired length after carbon nanotubes are manufactured. Especially in the arc discharge, it is difficult to adjust the length of the carbon nanotubes to be synthesized. Note that it is possible to use the growth period to adjust the length of the carbon nanotubes in the chemical vapor deposition, but this causes the structure to have a large number of defects as described above. Also, the purity of the obtained carbon nanotubes is not sufficiently high in any of the manufacturing methods described above, so that it is extremely complex and costly to obtain carbon nanotubes with a desired length in a desired quantity.

The present inventors found that an extremely high-purity carbon nanotube can be manufactured by forming a predetermined magnetic field in the generation area of the discharge plasma typically generated by arc discharge (see Kazunori Anazawa, Kei Shimotani, Chikara Manabe, Hiroyuki Watanabe et. al. "High-purity carbon nanotubes synthesis method by an arc discharging in magnetic field", Applied Physics Letters, (2002), Vol. 81, No. 4, p. 739–p. 741) It is contemplated that with this method, the discharge plasma including radicals such as $C^+$, C, and $C_2$ are confined in a predetermined magnetic field by generating the discharge plasma in the predetermined magnetic field, so that the collision probability of the charged particles in the discharge plasma increases, thereby increasing generation efficiency of the carbon nanotubes. As a result, it is possible to reduce the amorphous carbon particles and graphite particles which are the impurities. With this method, the purity of the carbon nanotubes is drastically improved.

In order to synthesize a high-purity carbon nanotube using the method, stabilization of the magnetic field formed by the magnetism generating unit is necessary. However, the temperature of a magnetism generating portion may rise due to the heat generated from the discharge plasma, which affects the magnetic field intensity. In particular, in the case of using the permanent magnet as the magnets, there occurs a phenomenon that the magnetic field intensity is annihilated when the temperature of the permanent magnet reaches a Curie temperature. Also, even when the temperature of the permanent magnet is below the Curie temperature, thermal demagnetization occurs, so that the magnetic field intensity varies depending on the temperature change of the magnetism generating portion. Therefore, it is necessary to suppress the rise in temperature of the magnetism generating portion.

SUMMARY OF THE INVENTION

The present invention has been made in view of the above circumstances and provides a manufacturing apparatus for a carbon nanotube, which can suppress an influence on a magnetic field due to heat generated from discharge plasma, and can stably manufacture a high-purity carbon nanotube with excellent industrial efficiency.

According to an aspect of the present invention, the manufacturing apparatus for a carbon nanotube includes:

at least two electrodes whose tips are opposed to each other;

at least a power supply that applies a voltage between the two electrodes to generate discharge plasma in a discharge area between the two electrodes; and at least a plurality of magnets that generates, in a generation area of the discharge plasma, at least one of a magnetic field of multiple directions and a magnetic field having a component in parallel with a flowing direction of a discharge current, in which a thermal shield wall made of a non-magnetic material is disposed between the magnets and the generation area of the discharge plasma.

According to the present invention, the thermal shield wall made of a non-magnetic material is disposed between the magnets and the generation area of the discharge plasma, so that the heat generated from the discharge plasma is effectively obstructed by the thermal shield wall and the heating of the magnets is suppressed. Thus, it is possible to prevent thermal demagnetization of the magnets and magnetic field annihilation. Accordingly, a high-purity carbon nanotube can be stably manufactured with excellent industrial efficiency.

According to the manufacturing apparatus of the present invention, the thermal shield wall includes a cooling unit, so that the thermal shielding efficiency is further improved, and the influence due to the heat generated from the discharge plasma can be eliminated. Also, by providing the cooling unit, heat resistance needed for the thermal shield wall can be relaxed, and/or the thermal shield wall can be placed much closer to the generation area of the discharge plasma.

According to the manufacturing apparatus of the present invention, at least the two electrodes and the generation area of the discharge plasma are received in one container. The reception of the electrodes and the generation area in the container enables adjustment of an atmosphere within the container, and it becomes possible to manufacture a carbon nanotube under various pressure conditions including an atmospheric pressure.

In this case, the plurality of magnets is disposed outside the container, and a part of the container may also serve as the thermal shield wall. A portion of the container placed between the generation area of the discharge plasma inside the container, and the plurality of magnets outside the container also serves as the thermal shield wall, so that the manufacturing apparatus of the present invention can be structured without increasing the number of parts. Further, the heat absorbed by the portion of the container which also serves as the thermal shield wall can be released by another portion thereof, thereby enhancing the thermal shielding efficiency.

Further, a sealed container may be adopted as the container. In this case, it is preferable to provide an atmosphere adjusting unit for adjusting at least one of a pressure and a gas type of an atmosphere inside the sealed container.

In the apparatus for manufacturing a carbon nanotube according to the present invention, it is preferable that the discharge plasma generated in the discharge area be arc plasma.

The apparatus for manufacturing a carbon nanotube according to the present invention includes, for example, the following three forms as the plurality of magnets.

(1)—a A form in which the plurality of magnets is selected from the group consisting of permanent magnets and electromagnets arranged along the flowing direction of the discharge current so as to surround at least one of the generation area of the discharge plasma and an area close to the generation area, and simultaneously, each of the plurality of magnets is arranged to direct the same pole toward the discharging area.

(1)—b A form in which the plurality of magnets includes even number of magnets, equal to or greater than four, selected from the group consisting of permanent magnets and electromagnets arranged along the flowing direction of the discharge current so as to surround at least one of the generation area of the discharge plasma and an area close to the generation area, and simultaneously, each of the plurality of magnets is arranged to have a pole opposite to that of the adjacent magnet directed toward the discharging area.

(2) A form in which the magnets are formed of one or two coils whose center axis is approximately aligned in the flowing direction of the discharge current.

In the apparatus for manufacturing a carbon nanotube according to the present invention, it is preferable that, of the two electrodes whose tips are opposed to each other, a magnetic flux density at an edge of the tip of the electrode that generates the discharge plasma be in a range from $10^{-5}$ T to 1 T, and that a density of the discharge current at the time of generating the discharge plasma be in a range from 0.05 A/mm$^2$ to 15 A/mm$^2$ with respect to an area of the tip of the electrode that generates the discharge plasma.

In the apparatus for manufacturing a carbon nanotube according to the present invention, it is preferable that the voltage applied to the electrodes by the power supply be in a range from 1 V to 30 V, and be a DC voltage. Also, in the case of the DC voltage, it is more preferable that an area of a tip of a cathode of the two electrodes whose tips are opposed to each other be equal to or less than an area of a tip of an anode thereof.

In the apparatus for manufacturing a carbon nanotube according to the present invention, it is preferable that at least the discharge area and the electrodes be received in the sealed container. In this case, it is preferable that the atmosphere adjusting unit be provided for adjusting at least one of the pressure and the gas type of the atmosphere inside the sealed container.

In the apparatus for manufacturing a carbon nanotube according to the present invention, it is preferable that the material of the electrodes be one of carbon and a material that contains carbon and has an electric resistivity in a range from 0.01 Ω·cm to 10 Ω·cm.

Note that, the term "thermal shielding" according to the present invention is a concept including not only mere thermal insulation but also heat releasing, cooling, and all other states where heat is not conducted eventually. Also, the term "thermal shield wall" according to the present invention represents a screen-like member having thermal shielding property based on the above definition, and its shape is not particularly limited.

BRIEF DESCRIPTION OF THE DRAWINGS

Preferred embodiments of the present invention will be described in detail based on the following drawings, wherein:

FIG. 3($b$) shows states of the lines of magnetic force where the permanent magnets are arranged such that the pole of each permanent magnet opposite to that of the adjacent permanent magnet faces the discharge area, and where only permanent magnets are extracted from FIG. 2;

FIG. 4($b$) is a perspective view showing a state of the lines of magnetic force when electromagnets are disposed on the same axis with an interval, and a voltage is applied to coils of the respective electromagnets, which is given as a specific example of a magnetic field space where the lines of magnetic force are approximately in parallel with the direction of discharge current, and the motion of charged particles in discharge plasma is restricted in the direction of the lines of magnetic force;

DETAILED DESCRIPTION OF THE PREFERRED EMBODIMENTS

Detailed description of the present invention is made hereinbelow.

In a manufacturing apparatus for a carbon nanotube according to the present invention, first, by applying a voltage between two electrodes whose tips are opposed to each other, discharge plasma is generated in a discharge area between the electrodes, and a predetermined magnetic field is formed in the discharge area for manufacturing a carbon nanotube. As a result, with the present invention, it is possible to reduce amorphous carbon particles and graphite particles, which are impurities. The predetermined magnetic field is at least a magnetic field having lines of magnetic force in multiple directions or a magnetic field having a component in parallel with the direction of a discharge current in a generation area of the discharge plasma.

The manufacturing apparatus for a carbon nanotube according to the present invention is further characterized in that a thermal shield wall made of a non-magnetic material is disposed between a plurality of magnets and the generation area of the discharge plasma. Hereinafter, description is made of preferred embodiments of the present invention.

[Embodiment 1]

Figure 1:
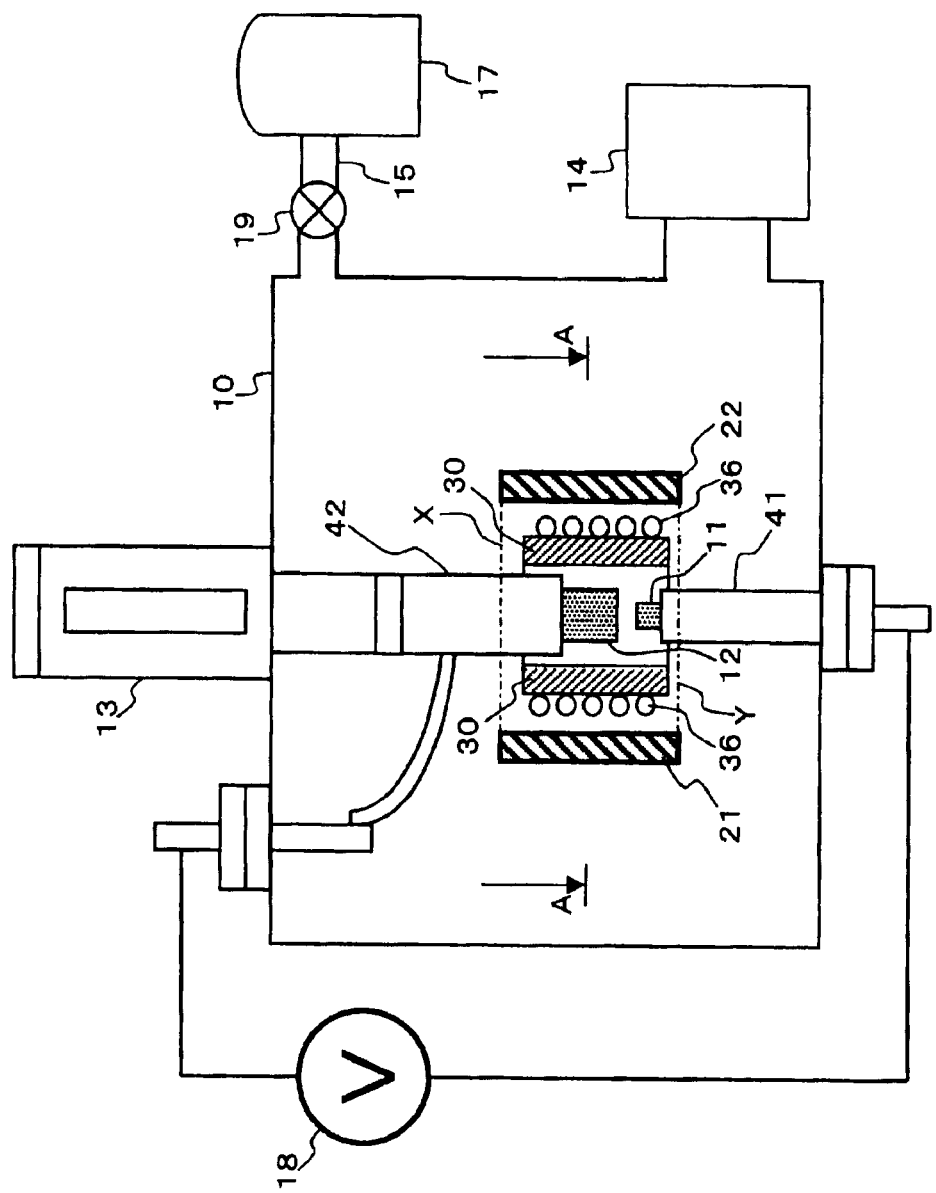
FIG. 1 is a schematic cross sectional view showing an example of an apparatus for manufacturing a carbon nanotube according to the present invention.
Figure 2:
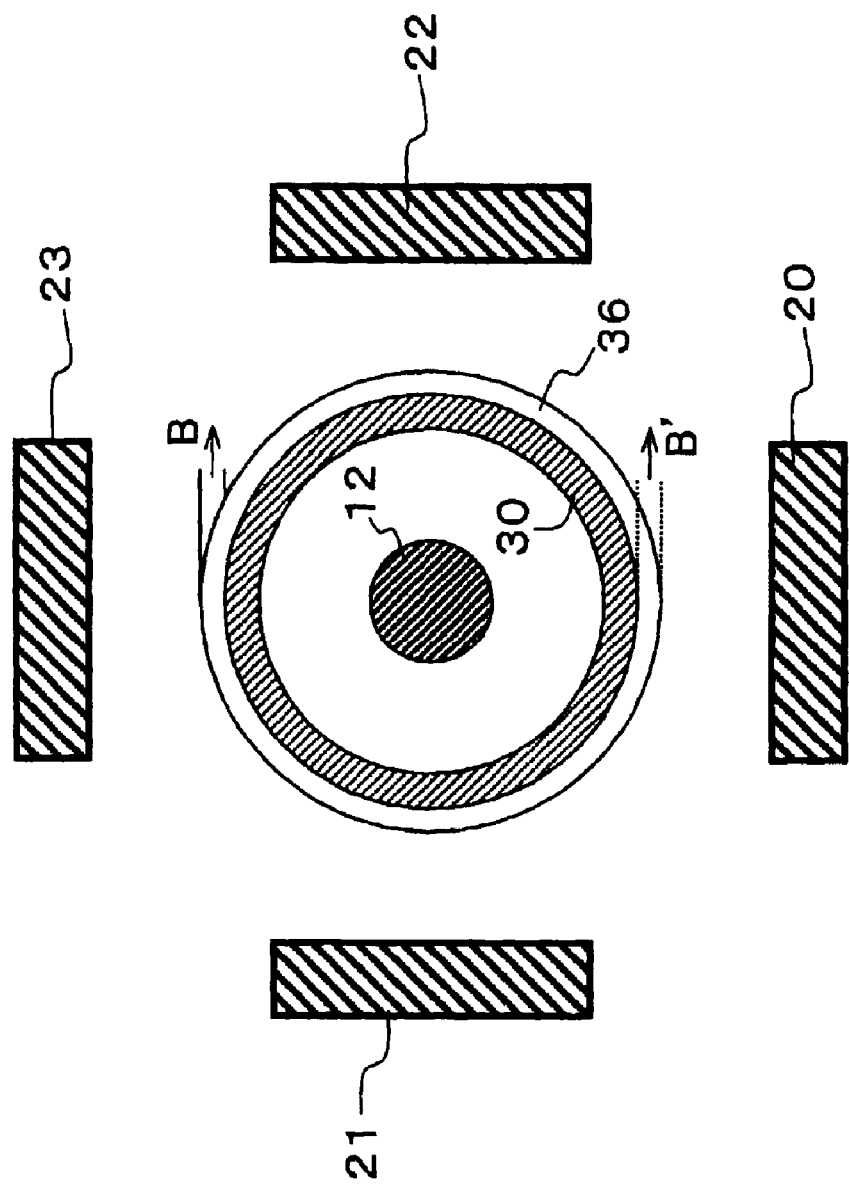
FIG. 2 is a cross sectional view taken along a line A—A of FIG. 1.

FIG. 1 is a schematic cross sectional view showing an example of the manufacturing apparatus for a carbon nanotube according to Embodiment 1 of the present invention, and FIG. 2 is a cross sectional view taken along a line A—A of FIG. 1. A part corresponding to the conventional carbon nanotube manufacturing apparatus shown in FIG. 1 includes: two electrodes (an electrode 12 serving as an anode, and an electrode 11 serving as a cathode) which are respectively held by holders 41 and 42, and disposed in a reaction container (chamber) 10 used as a sealed container, and whose tips are opposed to each other; a moving apparatus 13 which can slide the holder 42 for adjusting the interval between the electrode 11 and the electrode 12; a power supply 18 for applying a voltage between the electrodes 11 and 12; a vacuum pump 14 capable of decompressing the atmosphere in the reaction container 10; a gas cylinder 17 for storing desired gas; an inlet tube 15 interconnecting between the gas cylinder 17 and the reaction container 10; and an atmosphere adjusting unit including a valve 19 for opening/closing the interconnection. The carbon nanotube manufacturing apparatus shown in FIG. 1 further includes in a novel part according to the present invention; permanent magnets 20 to 23; a thermal shield wall 30; and a tube (cooling tube) 36 in addition to a conventional carbon nanotube manufacturing apparatus using discharge plasma. The permanent magnets 20 to 23 serving as a plurality of magnets are arranged along the flowing direction of the discharge current to surround the discharge area. Further, the thermal shield wall 30 having a cylindrical shape and formed of a non-magnetic material, and the tube 36 serving as a cooling unit and routed around the periphery of the thermal shield wall 30 like a coil, are arranged between the permanent magnets 20 to 23 and the electrodes 11 and 12.

That is, the permanent magnets 20 to 23 generate a predetermined magnetic field in the discharge area between the electrodes 11 and 12 where the discharge plasma is generated when a voltage is applied between the electrodes 11 and 12. Heat generated by the discharge plasma that is generated between the electrodes 11 and 12 is obstructed by the thermal shield wall 30, and is cooled down by the tube 36.

Note that FIG. 2 illustrates one end portion B of the tube 36, which appears in a cross section taken along the line A—A of FIG. 1, and another end portion B' of the tube 36, which should not appear in the cross section, and omits destinations to which the end portions B and B' are coupled. The end portions B and B' are actually coupled to a water supply pipe and a drain pipe, respectively, and structured to circulate water within the tube 36.

Examples of the formed predetermined magnetic field specifically include (1) a magnetic field space which is surrounded and is enclosed by lines of magnetic force in multiple directions, and (2) a magnetic field space where the lines of magnetic force are approximately in parallel with the flowing direction of the discharge current, and thus, the motion of the charged particles in the discharge plasma is restricted by the lines of magnetic force. As in this example, when the four permanent magnets are used, it is possible to form a magnetic field in the form of (1).

Figure 3A:
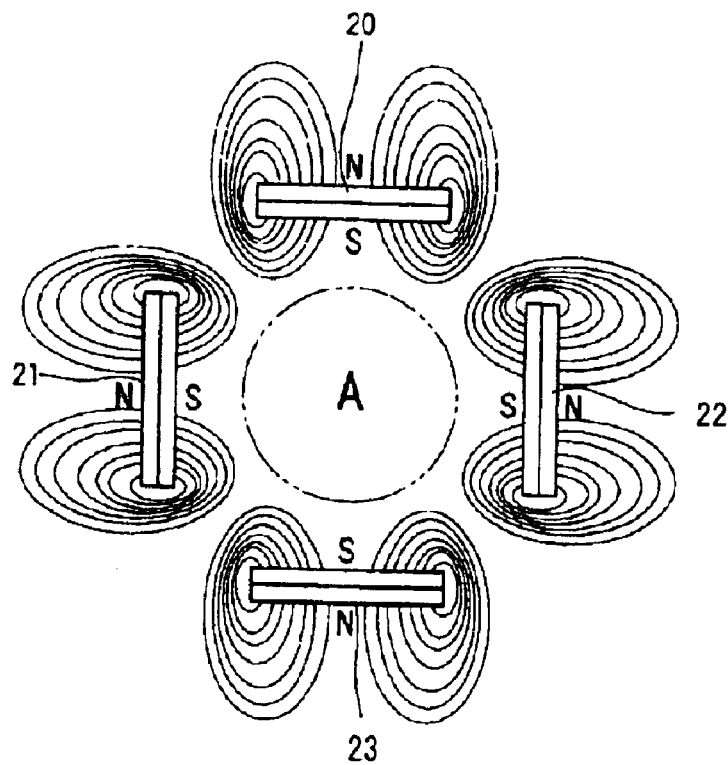
FIG. 3($a$) shows states of lines of magnetic force where all the permanent magnets are arranged such that the S pole faces a discharge area, and where only permanent magnets are extracted from FIG. 2.
Figure 3B:
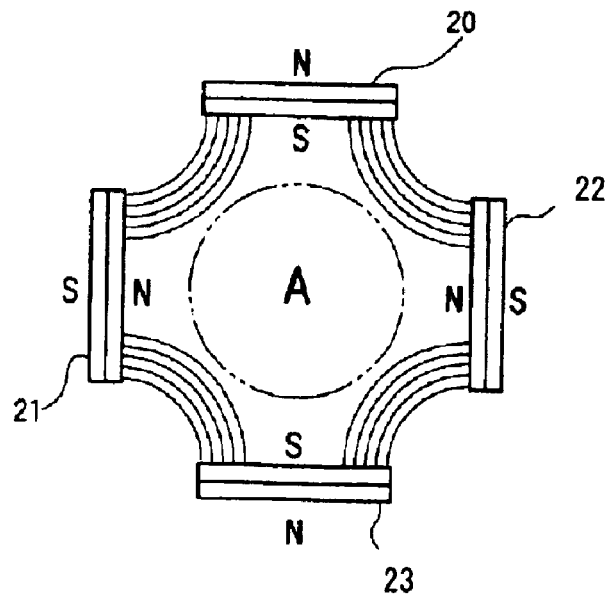

Description is made of a form of the predetermined magnetic field (1) to be formed. FIGS. 3(a) and 3(b) show a specific example of the magnetic field space (1) which is surrounded and enclosed by the lines of magnetic force in multiple directions. FIGS. 3(a) and 3(b) show states of the lines of magnetic force when the permanent magnets 20 to 23 are extracted from FIG. 2, and magnetic poles are determined. The lines of magnetic force are represented by a solid curve. Note that the lines of magnetic force shown in FIGS. 3(a) and 3(b) do not represent all possible forms, but represent typical ones.

FIG. 3(a) shows a state where all the permanent magnets 20 to 23 face the S poles toward the discharge area. In this case, the lines of magnetic force emitted from the individual permanent magnets 20 to 23 toward the discharge area repel one another, and thus, the area indicated by A is surrounded by the lines of magnetic force in multiple directions.

FIG. 3(b) shows an arrangement where the permanent magnets 20 and 23 face the S poles toward the discharge area, and the permanent magnets 21 and 22 face the N poles toward the discharge area. That is, the permanent magnets are arranged such that the pole of each permanent magnet opposite to that of the adjacent magnet faces the discharge area. In this case, the lines of magnetic force emitted from the individual permanent magnets 20 to 23 toward the discharge area converge on the neighboring permanent magnets, and thus, the area indicated by A is surrounded by the lines of magnetic force in multiple directions.

As described above, with the forms shown in FIG. 3(a) and FIG. 3(b), the magnetic field in multiple directions acts on the area indicated by A, and when the discharge plasma is generated in the area A, it is estimated that the motion of the charged particles in the discharge plasma is restricted in the space between the electrode 11 and the electrode 12. When a carbon nanotube is manufactured in this way, it is possible to efficiently synthesize the carbon nanotube with a high purity at a low cost on an industrial basis.

The magnetic field in those forms may be generated by using multiple permanent magnets, and the number of the magnets is not necessarily limited to four.

In the former "form where all the permanent magnets face the same pole toward the discharge area", three, or five or more flat permanent magnets, for example, may be arranged so as to surround the discharge area, or even two magnets may be arranged such that recesses of the two magnets face each other when curved permanent magnets are used. In addition, there is no upper limit to the number of the permanent magnets. Further, while the S poles face the discharge area in the form shown in FIG. 3(a), it is only necessary to face the same poles toward the discharge area, that is, an arrangement where the N poles face the discharge area may be possible.

In the latter "form where the permanent magnets are arranged such that the pole of each permanent magnet opposite to that of the adjacent magnet faces the discharge area", since it is necessary to alternate the poles of the neighboring permanent magnets, it is essential to use even number of permanent magnets. Also, it is necessary to surround the discharge area with lines of magnetic force, so it is essential to use four or more permanent magnets. However, there is no upper limit.

Another example of the predetermined magnetic field in the form of (1) as described above may be a form where the discharge plasma is generated in a cylindrical internal hole of a permanent magnet.

While the above description is provided for the form (1) of the predetermined magnetic field where the permanent magnets are used, the magnets to be used are not limited to the permanent magnets, and it is possible to use electromagnets or a combination of permanent magnets and electromagnets.

Figure 4A:
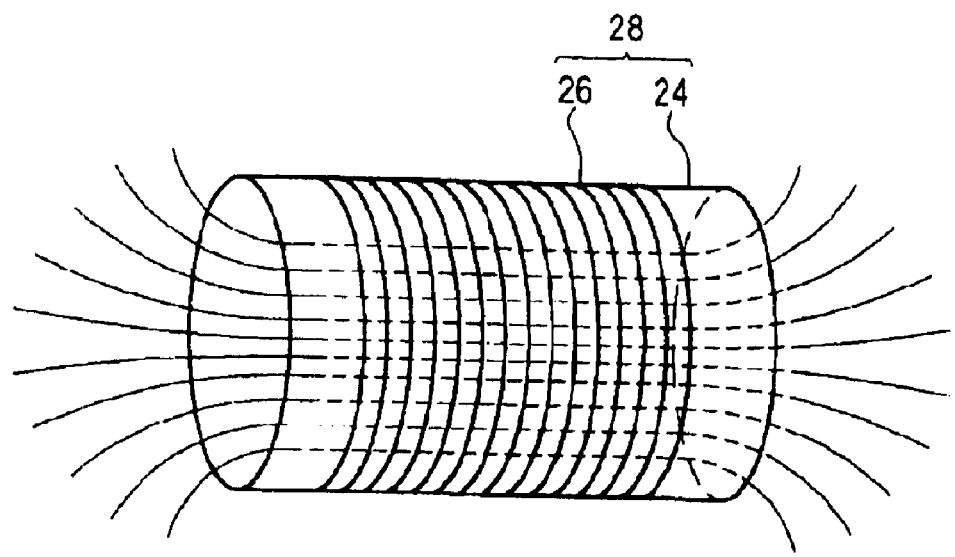
FIG. 4($a$) is a perspective view showing a state of the lines of magnetic force formed when a voltage is applied to a coil of an electromagnet, which is given as a specific example of a magnetic field space where the lines of magnetic force are approximately in parallel with the direction of discharge current, and the motion of charged particles in discharge plasma is restricted in the direction of the lines of magnetic force.
Figure 4B:
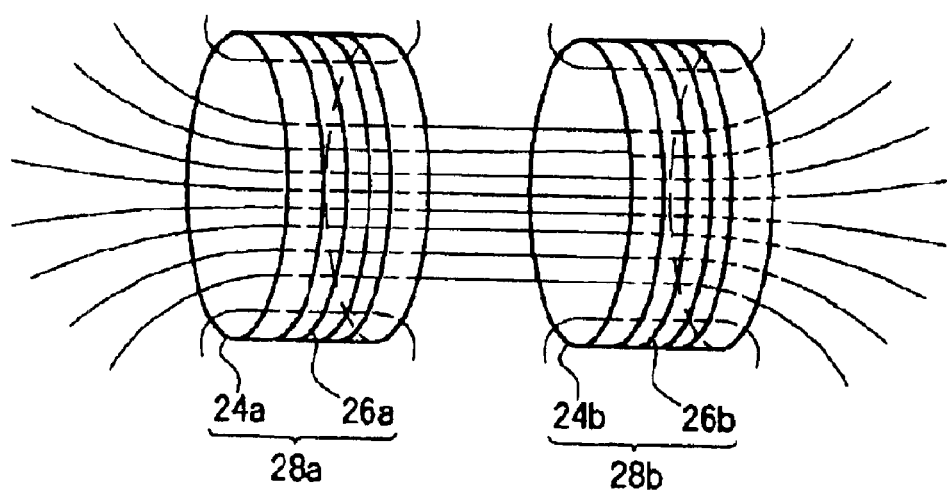

Description is made of a form of the predetermined magnetic field (2) to be formed. FIGS. 4(a) and 4(b) show specific examples of a magnetic field space (2) where the lines of magnetic force are approximately in parallel with the flowing direction of the discharge current, and the motion of the charged particles in the discharge plasma is restricted by the lines of magnetic force. FIG. 4(a) is a perspective view showing a state of the lines of magnetic force formed when a voltage is applied to a coil 26 of an electromagnet 28 obtained by winding the coil 26 on a cylinder 24, and FIG. 4(b) is a perspective view showing a state of the lines of magnetic force formed when electromagnets 28a and 28b obtained in the same way are disposed on the same axis with an interval therebetween, and a voltage is applied to coils 26a and 26b wound on individual cylinders 24a and 24b. The lines of magnetic force are represented by a solid curve and a broken curve. Note that the lines of magnetic force shown in FIGS. 4(a) and 4(b) do not represent all possible forms, but represent typical ones, and as for the individual lines of magnetic force, a part of them are shown.

In the form shown in FIG. 4(a), the lines of magnetic force pass through the inside of the cylinder 24. That is, the lines of magnetic force form a flux of lines of magnetic force approximately in parallel inside the cylinder 24. By generating discharge plasma inside the cylinder 24, and approximately matching the direction of the lines of magnetic force inside the cylinder 24 with the flowing direction of the discharge current, it is contemplated that the discharge plasma is confined inside the magnetic field.

In the form shown in FIG. 4(b), the lines of magnetic force pass through the inside of the cylinders 24a and 24b respectively, and simultaneously, a combined magnetic field is formed in the interval between them. In the combined magnetic field, the lines of magnetic force passing through the inside of the cylinders 24a and 24b respectively proceed straight ahead, pass through the inside of the other cylinder, and practically form an imaginary single coil although an extremely small portion of the lines of magnetic force leak from the space between the cylinders 24a and 24b. That is, in the space between the cylinders 24a and 24b, the lines of magnetic force form a flux of lines of magnetic force approximately in parallel. By generating discharge plasma in the space between the cylinders 24a and 24b, and approximately matching the direction of the lines of magnetic force in the space between the cylinders 24a and 24b with the flowing direction of the discharge current, it is contemplated that the discharge plasma is confined inside the magnetic field.

It is not necessary to exactly match the direction of the lines of magnetic force inside the cylinder 24 or the space between the cylinders 24a and 24b with the flowing direction of the discharge current. Even if the two directions do not match with each other exactly, it is only necessary to form a magnetic field which confines the discharge plasma inside. However, when an angle between the two directions is excessively large, the electrodes may be broken due to the relationship among the magnetic field, the electric field, and the force. Therefore, the angle is preferably set to a range of 0° to 30°, and more preferably to a range of 0° to 10°.

In addition, even if the flowing direction of the discharge current does not match exactly with the center axis of the magnetic field, it is only necessary to confine the discharge plasma inside the magnetic field. Note that since the straightness of the discharge plasma is lost if the discharge plasma is generated at a location excessively displaced from the center axis of the magnetic field, it is desirable that the axis of the flowing direction of the discharge current exists within 20% of the distance from the center axis of the magnetic field to "the inner surface of the cylinder 24" or "the extension of the inner surface of the cylinders 24a and 24b". Note that when the tip of the electrode is a flat surface, the discharge plasma is generated while an arbitrary point on the flat surface is serving as a base point. Therefore, although the flowing direction of the discharge current is not constant inherently, it is assumed that the line connecting the centers of the tips of the two electrodes opposed to each other is the axis of the flowing direction of the discharge current in the present invention.

Another example of the predetermined magnetic field in the form of (2) may be a form where a toroidal electromagnet is used, and the discharge plasma is generated in an internal hole of the electromagnet.

Although the types of the discharge plasma include arc plasma and glow plasma, arc plasma is preferable for efficiently manufacturing the carbon nanotube.

While in this embodiment, as shown in FIG. 1, the area in which the tips of the electrodes 11 and 12 are opposed to each other, that is, the generation area of the discharge plasma, is situated in the area surrounded by the permanent magnets 20 to 23 (between an imaginary plane X formed by connecting top ends of the permanent magnets 20 to 23 in the axial direction of the electrode 12 in the drawing and an imaginary plane Y formed by connecting bottom ends thereof), the permanent magnets 20 to 23 do not necessarily surround directly the generation area of the discharge plasma, but may surround its neighboring area. This is because the magnetic field formed by the permanent magnets 20 to 23 is also formed in the neighboring area surrounded by the permanent magnets 20 to 23, and the discharge plasma is properly confined in the magnetic field.

Since the distance of the electrode 12 from the imaginary plane Y (the area which can be considered to be the "neighboring area" surrounded by the permanent magnets 20 to 23) is determined so that the magnetic field formed by the permanent magnets 20 to 23 affects the generation area of the discharge plasma between the electrodes 11 and 12, the distance is automatically determined according to the magnetic force of the permanent magnets 20 to 23 and the like. Specifically, it is preferable to set the distance within a range which satisfies "the magnetic flux density in the discharge area" described later.

Note that it is preferable that the generation area of the discharge plasma be displaced from the center position of the area surrounded by the permanent magnets 20 to 23 (the center between the imaginary plane X and the imaginary plane Y) by a certain distance. At the center of the area surrounded by the permanent magnets 20 to 23, the direction of the formed magnetic field is, in most cases, orthogonal to the axial direction of the electrode 12, or the magnetic field is hardly formed since a component of the magnetic field cancel out. When the generation area is displaced from the center, the intensity of the magnetic field increases or the magnetic flux density of the magnetic field having the vector component effective in confining the discharge plasma further increases. Under this condition, a preferable area exists even in the neighborhood of the area surrounded by the permanent magnets 20 to 23. Specifically, as described above, this area is within the range which satisfies "the magnetic flux density in the discharge area" described later.

The range for the interval between the tips of the electrodes 11 and 12 is selected from the range enough to generate discharge plasma, and is automatically determined according to the voltage drop. In general, the interval may be selected from a range of approximately 0.1 to 5 mm.

Next, detailed description is made of the thermal shield wall as a feature of the present invention and the cooling unit as an optional element of the present invention.

As shown in FIGS. 1 and 2, disposed between the permanent magnets 20 to 23 and the generation area of the discharge plasma between the electrode 11 and the electrode 12 are the thermal shield wall 30 and the tube 36 that is wound in a coil shape around an outer periphery of the thermal shield wall 30. The generation area of the discharge plasma is surrounded by the thermal shield wall 30, so that the thermal shield wall 30 serves to obstruct the heat generated from the discharge plasma generated between the electrode 11 and the electrode 12 to effectively suppress the heating of the permanent magnets 20 to 23. Thus, it is possible to prevent thermal demagnetization of the plurality of magnets and magnetic field annihilation. Accordingly, a high-purity carbon nanotube can be stably manufactured with excellent industrial efficiency.

The thermal shield wall 30 needs to be non-magnetic in order not to affect the magnetic field generated by the permanent magnets 20 to 23. In addition, the thermal shield wall 30 needs to have heat resistance enough to resist the heat generated from the discharge plasma. Any material can be used as the thermal shield wall 30 without involving any problems as long as the material is non-magnetic and has desired heat resistance, and examples thereof include various inorganic materials. In the case where the cooling unit is present as in this embodiment, as the material of the thermal shield wall 30, it is desirable to use a high thermal conductivity material (for example, an arbitrarily selected metallic material, especially copper, a high thermal conductivity carbon material (graphite), or a material having a high heat resistance temperature such as tungsten, molybdenum, or tantalum). On the contrary, in the case where the cooling unit is absent, as the material of the thermal shield wall 30, it is desirable to use a low thermal conductivity material (for example, a ceramic material, a concrete material, a low thermal conductivity carbon material, a porous carbonaceous material of each of the materials, or the like)

In this embodiment, a cylindrical member (thermal shield wall 30) is used as the thermal shield wall. However, the thermal shield wall is not limited to the cylindrical member as long as the thermal shield wall is structured to be interposed between the magnets and the generation area of the discharge plasma and to enable obstruction of the heat generated from the discharge plasma. More specifically, the thermal shield wall may be structured to have a shape that surrounds the generation area of the discharge plasma, such as a quadratic prism or a prism. Alternatively, multiple wall-like members may be disposed between the magnets and the generation area of the discharge plasma such that the multiple wall-like members are placed only in positions to which the magnets are opposed along a periphery of the generation area of the discharge plasma, and not in positions to which no magnets are opposed.

In this case, it is naturally preferably that the thermal shield walls be placed in all the positions to which the magnets are opposed along the periphery of the generation area of the discharge plasma. However, even in a state where there remains a portion of the generation area of the discharge plasma, to which the magnets are opposed, if there is even a small portion of the thermal shield wall interposed between the magnets and the generation area of the discharge plasma, an effect of thermal shield can be exhibited more reliably than in the structure where the heat is not obstructed by the thermal shield wall at all. Therefore, the concept of the present invention includes the above-mentioned state.

Similarly, in the present invention, the thermal shield wall preferably forms a plane across the entire surface thereof. However, even in a state where there exists a hole in a part of the thermal shield wall, the effect of thermal shielding can be exhibited more reliably than in the structure where the heat is not obstructed by the thermal shield wall at all. Therefore, the concept of the present invention also includes the above-mentioned state.

The width of the thermal shield wall according to the present invention depends on various factors such as its material, a distance from the generation area of the discharge plasma, a discharge time, presence or absence of the cooling unit, and the Curie temperature of the magnets. By taking all these factors into consideration, the thermal shield wall can be designed appropriately so as to have a suitable thermal shielding efficiency.

This embodiment has a structure in which the tube 36 as the cooling unit is wound around the outer periphery of the thermal shield wall 30 to circulate water through the tube 36 to thereby positively cool the heat absorbed by the thermal shield wall 30. By providing the cooling unit, the thermal shielding efficiency is further improved, and an influence due to the heat generated from the discharge plasma can be eliminated. Also, the thermal shield wall 30 is likely to be considerably high in temperature due to its extremely close proximity to the discharge plasma. However, by providing the cooling unit, the heat resistance needed for the thermal shield wall 30 can be relaxed, thereby achieving an increased degree of flexibility in selection of a material as well as in design.

Note that, the coolant circulating through the tube 36 is not limited to water, and any conventional publicly known coolant, whether it is liquid or gas, is applicable. Specific examples of the coolant other than water include nitrogen gas, ethylene glycol, liquid nitrogen, and liquid helium. In addition, a material with high heat conductivity is preferable for the material of the tube 36, and a material similar to those referred to in the description of the thermal shield wall is suitably applied.

This embodiment is described by taking as an example the form of forced cooling using water (coolant) as the cooling unit. However, the present invention is not necessarily limited to the form. Upon manufacturing a carbon nanotube, whichever structure is adopted as the cooling unit, it is preferable to use the cooling unit to prevent the permanent magnets 20 to 23 from reaching the Curie temperature, and it is more preferable to use the cooling unit to prevent the permanent magnets 20 to 23 from reaching the temperature at which thermal demagnetization thereof occurs.

Other examples of the cooling unit include: a heat releasing unit obtained by connecting the thermal shield wall with the reaction container by using a high thermal conductivity material, connecting the thermal shield wall with a heat releasing surface placed outside the reaction container by using the high thermal conductivity material, or the like; a unit that exposes the thermal shield wall and/or another cooling unit to the wind by using a fan; and a unit that cools the thermal shield wall and/or another cooling unit by using a Peltier element.

Next, description is made of an example of manufacturing a carbon nanotube by using the manufacturing apparatus for carbon nanotube shown in FIG. 1.

The reaction container (chamber) 10 is a sealed container having a cylindrical shape (disposed such that the end surfaces face upward and downward respectively in the drawing), and although the container is preferably made of a metal, especially stainless steel, the container may be suitably made of an aluminum alloy, quartz, or the like. Additionally, the shape is not limited to a cylindrical shape, and a desired shape such as a box shape may be used. Further, when the atmosphere of the discharge area is an atmosphere of air at an atmospheric pressure, and the carbon nanotube is deposited around the tip of the electrode 11, the reaction container 10 is not indispensable, or the reaction container 10 is not necessarily a sealed container.

The two electrodes 11 and 12 whose tips are opposed to each other are disposed in the reaction container 10. Under this condition, when the material of the reaction container 10 is the one having electrical conductivity such as a metal, the reaction container 10 and the electrodes 11 and 12 are fixed while being electrically insulated from each other. As the arrangement of the two electrodes 11 and 12, such an arrangement that the axes of the two electrodes 11 and 12 have a certain angle and the tips thereof are close to each other is possible in addition to the arrangement shown in FIG. 1 where the axes of the two electrodes coincide with each other so that the electrodes are exactly opposed to each other. The expression "tips are opposed to each other" used in the present invention is a concept also including the latter case, but of course, desirably represents the former form shown in FIG. 1.

As for the arrangement of the electrodes 11 and 12, when the opposing surfaces of the electrodes 11 and 12 are in parallel with each other, the discharge such as arc discharge is stabilized, and the carbon nanotube is synthesized efficiently.

The material of the two electrodes 11 and 12 is desirably carbon. However, any substance that contains carbon and has an electric resistivity within a range of 0.01 $\Omega$·cm to 10 $\Omega$·cm (preferably 0.01 $\Omega$·cm to 1 $\Omega$·cm) can be suitably used.

The shape of the two electrodes 11 and 12 is not particularly limited, and although examples of the shape may include: a cylindrical shape; a rectangular column shape; and a truncated cone shape, the cylindrical shape is desirable. In addition, although the diameters of the tips (in the case where the tips are not circular, the diameters of the tips having the same area as the circular tip) of the two electrodes 11 and 12 are not especially limited, each of the diameters is preferably 1 mm or more and 100 mm or less.

As for the opposing two electrodes 11 and 12, the area of the tip of the electrode 11 is preferably equal to or less than the area of the tip of the electrode 12. The purity of the obtained carbon nanotube further increases when the area of the tip of the electrode 11 is equal to or less than the area of the tip of the electrode 12. The ratio of the areas between them (the tip area of the electrode 11/the tip area of the electrode 12) is preferably 0.1 to 0.9, and more preferably 0.2 to 0.5.

A coolant circulating pipe (not shown) as an electrode cooling unit is attached to the holders 41 and 42 holding the two opposing electrodes 11 and 12. The heat generated upon generation of the discharge plasma heats the electrodes 11 and 12 and the electrodes are heated to high temperatures, causing the discharge condition to be changed in some cases. When the heating progresses to an extremely high temperature, the carbon nanotube deposited at the tip of the electrode may be decomposed again or vaporized. However, the coolant circulating pipe attached to the holders 41 and 42 restrains the electrodes 11 and 12 from being heated, and thus, it is possible to continuously generate the discharge plasma in a stable manner for even a longer period of time.

Though the routing of the coolant circulating pipe is not especially restricted, it is preferable to efficiently route the coolant circulating pipe to effectively cool the electrodes 11 and 12. There is also no restriction to the material of the coolant circulating pipe and the type of the coolant, and it is possible to properly apply ones similar to the tube 36 and the coolant, referred to in the description of the cooling unit for the thermal shield wall.

Copper having high heat conductivity is also used for the holders 41 and 42. Thus, the holders 41 and 42 themselves serve as the heat releasing unit referred to in the description of the cooling unit for the thermal shield wall. In this respect, the structure itself of the holders 41 and 42 can be considered as a type of the electrode cooling unit.

The electrode cooling unit is not limited to the constitution described above, and a constitution in which the individual electrodes can be cooled may be used without involving any problems.

Note that while both of the holders 41 and 42 are constituted so as to serve as the electrode cooling unit in this embodiment, only one electrode may be provided with the electrode cooling unit. It is of course desirable that both of the electrodes are provided with the electrode cooling unit. However, if only one electrode is provided with the electrode cooling unit, the cathode on which the carbon nanotube is generated and deposited is preferably provided with the electrode cooling unit.

By using the atmosphere adjusting unit including the vacuum pump 14, the gas cylinder 17, the inlet tube 15, and the valve 19 to properly adjust the atmosphere inside the reaction container 10, the atmosphere in the discharge area is set to a desired state. Specifically, the vacuum pump 14 can compress and decompress the inside of the reaction container 10. After the inside of the reaction container 10 is decompressed by the vacuum pump 14, the valve 19 is opened, and a desired gas stored in the gas cylinder 17 is introduced into the reaction container 10 through the inlet tube 15, thereby obtaining the desired gas atmosphere. It should be understood that the operation for adjusting the atmosphere is not necessary when the atmosphere is the atmosphere of air at the atmospheric pressure.

The vacuum pump 14 may be a rotary pump, a diffusion pump, a turbo molecule pump, or the like.

The pressure of the atmosphere inside the reaction container 10 (that is, the atmosphere in the discharge area, used in the same sense hereafter) may be 0.01 Pa or more and 510 kPa or less, preferably, 0.1 Pa or more and 105 kPa or less, and more preferably 13 Pa or more and 70 kPa or less. Under such a pressure, the carbon nanotube with a high purity can be manufactured.

Although an atmospheric gas in the reaction container 10 is not specifically limited, air, helium, argon, xenon, neon, nitrogen, hydrogen, and mixture of these types of gases are preferable. In the case of introducing desired gas, after the inside of the reaction container 10 is exhausted by the vacuum pump 14, the desired gas may be introduced up to a predetermined pressure from the gas cylinder 17 that contains the desired gas.

In the present invention, the atmosphere inside the reaction container 10 may further include a gas including a substance containing carbon. In this case, the atmosphere may only include the gas including the substance containing carbon, or the gas including the substance containing carbon may be introduced into the atmosphere of the different types of gases described above. By providing the gas including the substance containing carbon in the atmosphere, it is possible to produce the carbon nanotube with a special structure. This carbon nanotube has a structure of carbon grown around a carbon nanotube as the center.

Although the applicable substance containing carbon is not limited thereto, hydrocarbons such as ethane, methane, propane, and hexane; alcohols such as ethanol, methanol, and propanol; ketones such as acetone; petroleums; gasolines; or an inorganic substance such as carbon monoxide and carbon dioxide; or the like can be used. Among those, acetone, ethanol, and hexane are especially preferable.

Anything that generates magnetic force may be used as the permanent magnets 20 to 23 serving as the plurality of magnets. As described above, the electromagnet may be applied in place of the permanent magnet. Examples of the predetermined magnetic field to be formed include ones with the shape shown in FIGS. 3(a), 3(b), 4(a), and 4(b) as described above. In the carbon nanotube manufacturing apparatus in FIG. 1, the two types of magnetic fields shown in FIGS. 3(a) and 3(b) are selectable.

In this embodiment, the thermal shield wall for suppressing the rise in temperature of the permanent magnets 20 to 23 is provided, making it unnecessary to provided another cooling unit. However, a magnet cooling unit that positively cools the magnets may also be provided for reasons of design, structure, or condition, that is, in order to cause the discharge to be stable for a long period of time by suppressing the rise in temperature of the magnets more reliably, or in order to simplify the structure of the thermal shield wall. Examples of the magnet cooling unit applicable to the present invention include various units described above as the examples of the cooling unit for the thermal shield wall (for example, the forced cooling using water (coolant), the heat releasing unit, the unit that exposes the wind, and the unit that uses a Peltier element)

In the predetermined magnetic field to be formed, when the lines of magnetic force in the discharge area include more components which are approximately in parallel with the axes of the electrodes 11 and 12 (that is, the flowing direction of the discharge current caused between the electrodes 11 and 12), the high-purity carbon nanotube is manufactured, and thus, this condition is preferable. That is, the magnetic field in FIG. 3(a) is preferable to the one in FIG. 3(b). The arrangement in FIG. 3(a) is used in this embodiment.

In the carbon nanotube manufacturing apparatus of FIG. 1 on which the conditions described above are set, by applying a voltage between the electrodes 11 and 12 by using the power supply 18, discharge plasma is generated between the electrodes 11 and 12. Although the types of the discharge plasma include arc plasma, glow plasma, and the like, arc plasma is preferable for efficiently manufacturing a carbon nanotube.

When conducting the arc discharge, a contact arc process may be conducted before the arc discharge. The contact arc process is a process where, after the voltage is applied while the electrodes 11 and 12 are in contact with each other, the moving apparatus 13 spaces apart the electrodes 11 and 12 by a certain inter-electrode distance, and the discharge plasma is generated. With this process, discharge plasma is generated easily and quickly in a stable manner.

Though the voltage applied between the electrodes 11 and 12 may be DC or AC, DC is preferable for increasing the purity of the obtained carbon nanotube. When AC is applied, there is no distinction between the electrodes 11 and 12 in terms of polarity.

The discharge current density when the discharge plasma is generated is preferably 0.05 A/mm$^2$ or more and 15 A/mm$^2$ or less, and more preferably 1 A/mm$^2$ or more and 5 A/mm$^2$ or less with respect to the area of the tip of the electrode generating the discharge plasma. Here, "the electrode generating the discharge plasma" means the cathode in the case of applying the DC voltage, and means the electrode with the smaller tip area in the case of applying the AC voltage (this holds true throughout other provisions in the present invention).

The voltage applied between the electrodes 11 and 12 by the power supply 18 is preferably 1 V or more and 30 V or less, and more preferably 15 V or more and 25 V or less. Since as a result of the discharge, the tip of the electrode 12 is consumed, the interval between the electrodes 11 and 12 changes during the discharge. It is preferable to control the voltage applied between the electrodes 11 and 12 to become constant by properly adjusting the interval between the electrodes 11 and 12 using the moving apparatus 13.

The magnetic flux density in the predetermined magnetic field is preferably $10^{-5}$ T or more and 1 T or less at the tip outside edge of the electrode generating the discharge plasma of the two opposing electrodes 11 and 12. When the magnetic flux density is less than $10^{-5}$ T, it is difficult to form an effective magnetic field, and when the magnetic flux density exceeds 1 T, it may be difficult to dispose the permanent magnets 20 to 23, which generate the magnetic field inside the apparatus, close to the generation area of the discharge plasma. Thus, both the cases are not preferable. When the magnetic flux density is $10^{-4}$ T or more and $10^{-2}$ T or less, since stable discharge is generated, it is possible to efficiently generate the carbon nanotube.

When the discharge plasma is generated between the electrodes 11 and 12 as described above, carbon is separated from the surface of the electrode 12, and then reacts to generate the carbon nanotube. The generated carbon nanotube are deposited on the surface of the tip of the electrode 11, in a neighborhood thereof, and also on the inner wall of the reaction container 10.

As described above, the thermal shield wall (thermal shield wall 30) and the cooling unit (tube 36) are interposed between the permanent magnets 20 to 23 as the plurality of magnets and the generation area of the discharge plasma, so that the heat generated from the discharge plasma is effectively obstructed, and the heating of the permanent magnets 20 to 23 is suppressed. Thus, it is possible to prevent thermal demagnetization of the permanent magnets 20 to 23 and magnetic field annihilation. Accordingly, a high-purity carbon nanotube can be stably manufactured with excellent industrial efficiency. In addition, the discharge plasma can be continuously generated in a stable manner for a long period of time.

[Embodiment 2]

In Embodiment 2, description is made of a preferred embodiment of the manufacturing apparatus having a structure in which the two electrodes and the generation area of the discharge plasma are received in one container, the plurality of magnets is disposed outside the container, and a part of the container also serves as the thermal shield wall.

Figure 5:
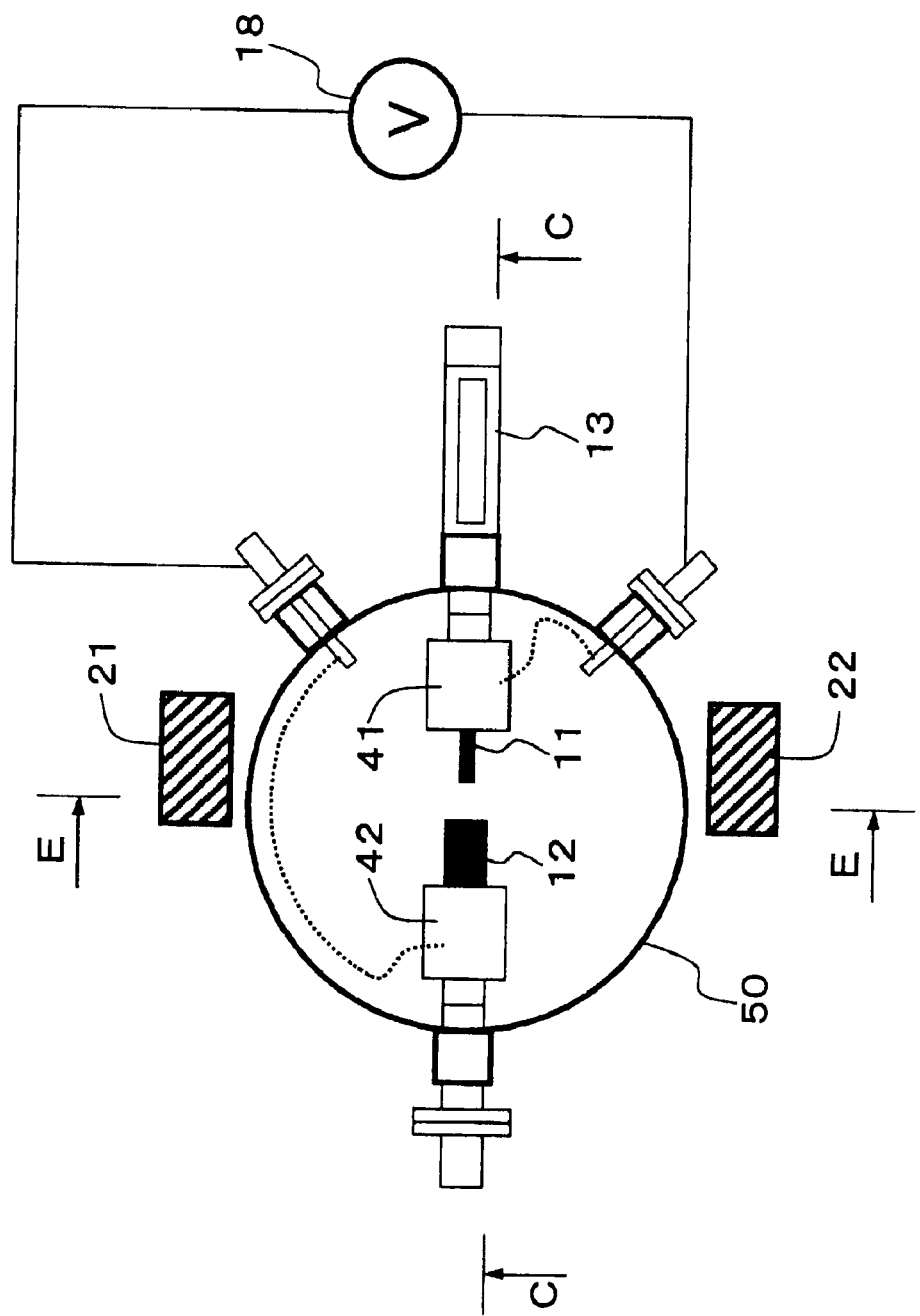
FIG. 5 is a schematic cross sectional view showing another example of an apparatus for manufacturing a carbon nanotube according to the present invention.
Figure 6:
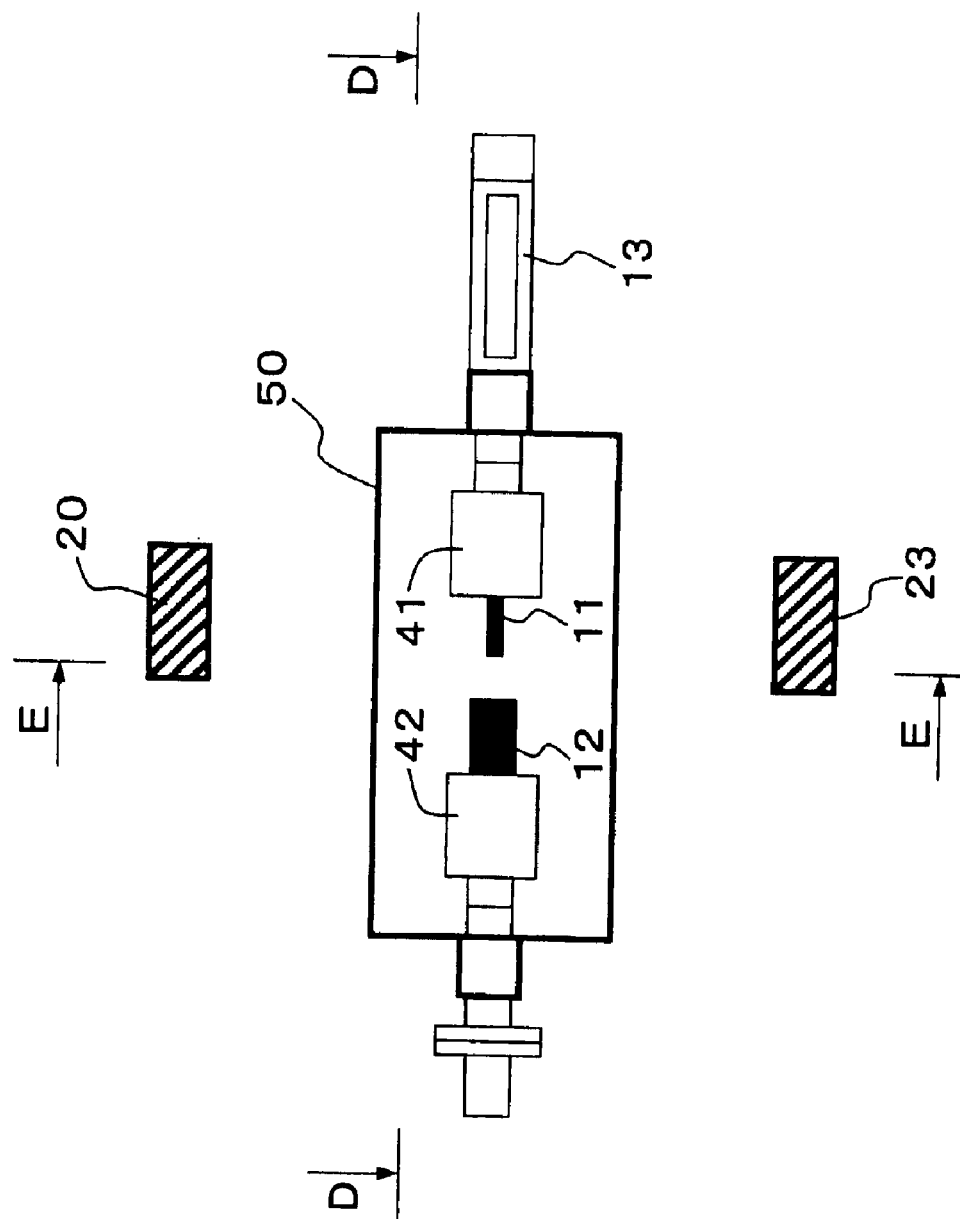
FIG. 6 is a cross sectional view taken along a line C—C of FIG. 5.

FIG. 5 is a schematic cross sectional view showing an example of a manufacturing apparatus for a carbon nanotube according to Embodiment 2 of the present invention. FIG. 6 is a cross sectional view taken along a line C—C of FIG. 5 (FIG. 5 is a cross sectional view taken along a line D—D of FIG. 6). Further, FIG. 7 is a cross sectional view taken along a line E—E of FIGS. 5 and 6.

Figure 7:
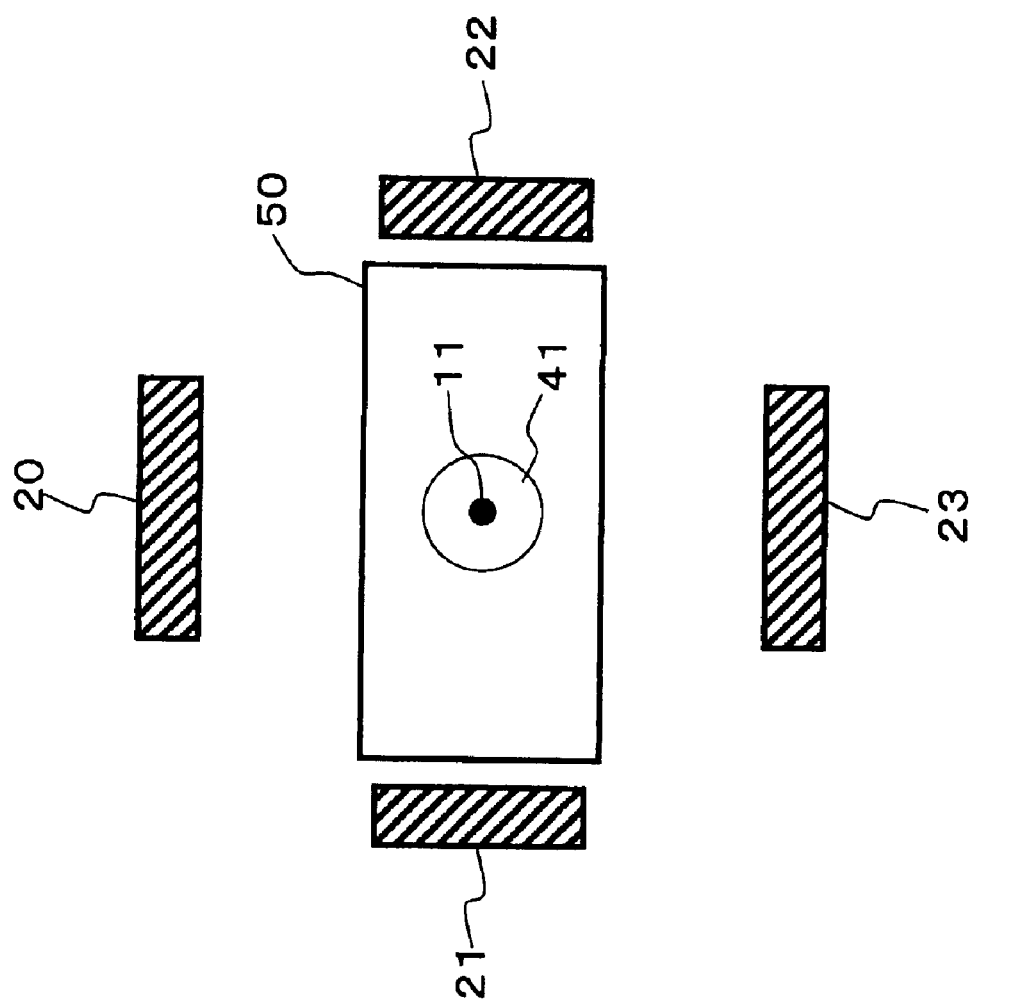
FIG. 7 is a cross sectional view taken along a line E—E of FIGS. 5 and 6.

The manufacturing apparatus for a carbon nanotube shown in FIGS. 5 to 7 includes: the two electrodes (the electrode 12 serving as an anode and the electrode 11 serving as a cathode) which are respectively held by the holders 41 and 42, and disposed in a reaction container (container) 50 that is used as a sealed container and has a flat cylindrical shape, and whose tips are opposed to each other; the moving apparatus 13 that can slide the holder 42 holding the electrode 12 for adjusting the interval between the electrode 11 and the electrode 12; the power supply 18 for applying a voltage between the electrode 11 and the electrode 12; and the permanent magnets 20 to 23 arranged to surround the discharge area between the electrode 11 and the electrode 12.

That is, the permanent magnets 20 to 23 generate a predetermined magnetic field in the discharge area between the electrodes 11 and 12 where the discharge plasma is generated when a voltage is applied between the electrodes 11 and 12. In this embodiment, most of members shown in FIGS. 5 to 7 are the same as the corresponding members described above and shown in FIGS. 1 and 2 according to Embodiment 1. Thus, in FIGS. 5 to 7, the members having the same functions as those of the corresponding members of Embodiment 1 are denoted by the same reference numerals as those of FIGS. 1 and 2, and detailed description thereof is omitted.

In this embodiment, the thermal shield wall is structured of a part of the reaction container 50 itself. That is, according to this embodiment, a group of the electrode 11, the electrode 12, and the generation area of the discharge plasma therebetween are placed inside the reaction container 50, and another group of the permanent magnets 20 to 23 are placed outside the reaction container 50. Thus, a part of a wall of the reaction container 50 is necessarily interposed between the two groups, and the wall has a function to obstruct the heat generated from the discharge plasma. Accordingly, a portion of the wall also serves as the thermal shield wall that is a feature of the present invention.

The reaction container 50 structuring the thermal shield wall needs to be non-magnetic in order not to affect the magnetic field generated by the permanent magnets 20 to 23. In addition, the reaction container 50 needs to have heat resistance enough to resist the heat generated from the discharge plasma. Any material can be used as the reaction container 50 without involving any problems as long as the material can be used as a general reaction container, and there can be used the materials exemplified as preferable materials of the thermal shield walls in Embodiment 1. If the heat absorbed by the portion of the reaction container 50 which also serves as the thermal shield wall is expected to be released by another portion thereof, it is desirable to use the a high thermal conductivity material described above in Embodiment 1.

According to the present invention, the reaction container 50 also serving as the thermal shield wall is disposed between the permanent magnets (a plurality of magnets) 20 to 23 and the generation area of the discharge plasma, so that the heat generated from the discharge plasma is effectively obstructed, and the heating of the permanent magnets 20 to 23 can be suppressed. Thus, it is possible to prevent thermal demagnetization of the permanent magnets 20 to 23 and magnetic field annihilation. Accordingly, a high-purity carbon nanotube can be stably manufactured with excellent industrial efficiency. In addition, the discharge plasma can be continuously generated in a stable manner for a long period of time.

According to the present invention, a part of the reaction container 50 also serves as the thermal shield wall, so that the manufacturing apparatus of the present invention can be structured without increasing the number of parts. Further, the heat absorbed by the portion of the reaction container 50 which also serves as the thermal shield wall can be released by other portions of the reaction container 50, thereby enhancing the thermal shielding efficiency. In that sense, in the structure of this embodiment, it can be said that the thermal shield wall includes the cooling unit.

Another cooling unit can be added to the reaction container 50 to thereby positively cool the heat absorbed by the reaction container 50. By including the cooling unit, the thermal shielding efficiency is further improved, and an influence due to the heat generated from the discharge plasma can be eliminated. Also, by including the cooling unit, the heat resistance needed for the reaction container 50 can be relaxed, and/or the thermal shield wall can be placed closer to the generation area of the discharge plasma (the reaction container 10 can be downsized). Regarding a specific structure of the cooling unit, the same structure described in Embodiment 1 can be applied to this embodiment.

As described above, according to the present invention, in a discharge plasma method such as the arc discharge capable of manufacturing the relatively high-purity carbon nanotube with ease, the inexpensive porous carbonaceous material is used for at least one of the electrodes as the source for supplying the raw material. Therefore, the carbon nanotube can be manufactured at an extremely low cost.

As a result of research by the present inventors, it becomes apparent that in the case of generating the discharge plasma in a predetermined magnetic field, the length of a carbon nanotube can be controlled according to the discharge time. Therefore, according to the manufacturing apparatus of the present invention which can continuously generate the discharge plasma in a stable manner for a long period of time, there is also an effect that it is possible to properly adjust the shape, especially the length, of a carbon nanotube.

Note that this embodiment is an example of implementing the present invention, and may be variously modified by those skilled in the art based on conventionally known findings as far as the embodiments includes the structural elements of the present invention.

EXAMPLES

Hereinafter, description is made of examples of the present invention. However, the present invention is not limited to the examples.

Example 1

The manufacturing apparatus shown in FIGS. 5 to 7 is used to manufacture a carbon nanotube. Hereinafter, description is made of specific requirements for the individual constitution of the manufacturing apparatus.

Reaction container 50: A cylindrical container chamber made of stainless steel. 182 mm in diameter and 89 mm in height. The thickness of the stainless steel is 9 mm.

Electrode (cathode) 11: A cylindrical graphite rod with an outer diameter of 5 mm (purity: 99.9% or more).

Electrode (anode) 12: A cylindrical graphite rod with an outer diameter of 15 mm (purity: 99.9% or more).

Tip position of the electrode 11: A position displaced by 42 mm toward the electrode 12 side from a center of each of the permanent magnets 20 to 23 in an axial direction of the electrode 11 and the electrode 12.

Moving apparatus 13: Capable of moving the electrode 11 with a stepping motor. Adjusts to maintain the interval between the electrodes 11 and 12 constant during plasma discharge.

Power supply 18: A DC arc welding power supply (Osaka Denki AR-SB300) capable of controlling the current from 20 A to 300 A.

Permanent magnets 20 to 23: Rectangle ferrite magnets with a length of 64 mm, a width of 151 mm, and a thickness of 64 mm. The minimum distance between the opposing permanent magnets is 210 mm. The magnetic flux density at the surfaces of the magnets is 130 mT. The magnetic flux density at the edge of the tip of the electrode is 5 mT. The permanent magnets are placed in positions each 105 mm apart from the generation area of the discharge plasma. The minimum distance from the reaction container 50 is 18 mm.

Holder 41: A copper cylinder with a diameter of 40 mm and a length of 40 mm. The coolant circulating pipe through which water circulates is routed inside the holder so as to control the temperature at the tip of the electrode 11 within 300° C.

Holder 42: A copper cylinder with a diameter of 40 mm and a length of 40 mm. The coolant circulating pipe through which water circulates is routed inside the holder so as to control the temperature at the tip of the electrode 12 within 300° C.

The manufacturing apparatus described above was used to manufacture the carbon nanotube. The inside of the reaction container 50 was not decompressed, and the carbon nanotube was manufactured at 101.325 kPa (one atmospheric pressure). To generate arc discharge between the electrodes 11 and 12, the contact arc process was conducted first, and then, the electrodes 11 and 12 were spaced apart by 0.5 mm to 3 mm after the start of the discharge. The voltage drop was DC of approximately 20 V, and the current was 68 A. The discharge was conducted for 1 minute.

At this time, a surface thermometer is attached to the surface of the permanent magnet 21 which is on the side opposed to the electrode of the permanent magnets 20 to 23 in the manufacturing apparatus, and temperature transition of the surface of the permanent magnet 21 was checked from the start to end of a discharge operation. The results are shown in a graph of FIG. 10. Also, the graph is examined below in a section <Checking of Thermal Shielding Efficiency>.

Figure 8:
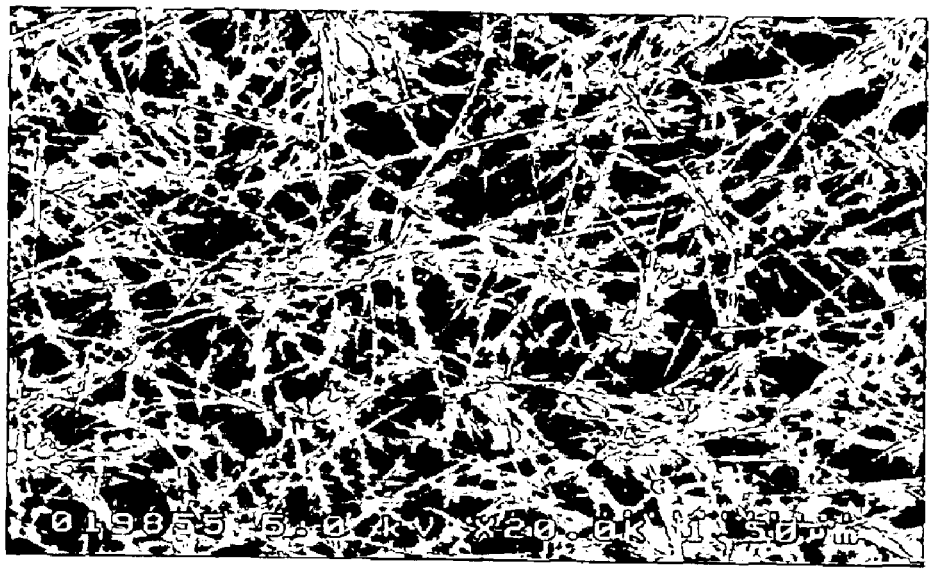
FIG. 8 is a scanning electron microscope photograph (at a magnifying power of 20000) of a surface of a cathode to which a carbon nanotube manufactured in Example 1 of the present invention is adhered.
Figure 9:
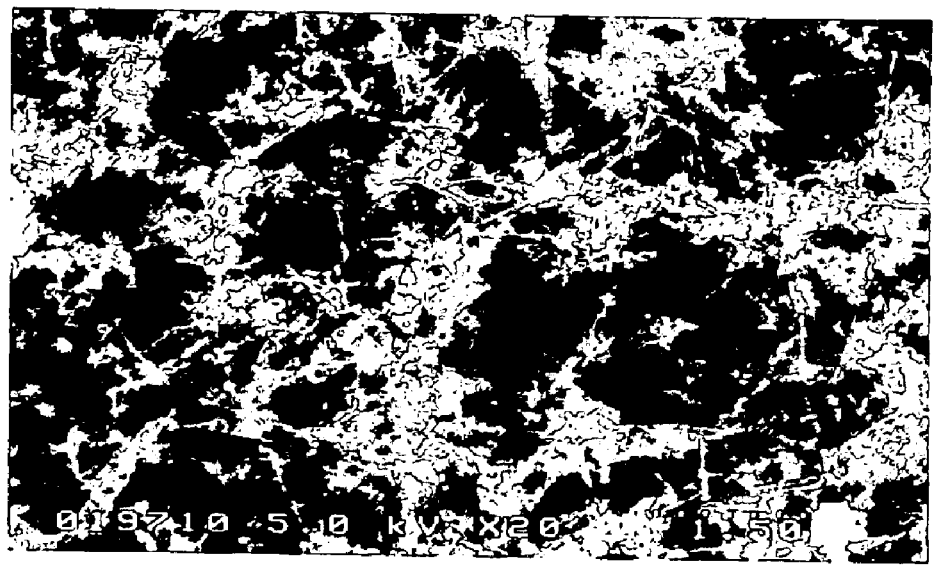
FIG. 9 is a scanning electron microscope photograph (at a magnifying power of 20000) of a surface of a cathode to which a carbon nanotube manufactured in Comparative Example 1 of the present invention is adhered.

After discharging, the electrode 11 was taken out, and the tip thereof was observed by a scanning electron microscope. For the observation using the scanning electron microscope, a scanning electron microscope S-4500 manufactured by Hitachi Ltd., was used, and the observation was performed at the magnifying power of 20000. A scanning electron microscope (SEM) photograph obtained at this time is shown in FIG. 8. Note that the magnifying power for the photograph has an error to a certain degree depending on the extent to which the photograph was enlarged (the same applies to subsequent description). As a result of the observation using the scanning electron microscope, it was confirmed that a carbon nanotube having a high purity (approximately 95%) was generated.

Example 2

The manufacturing apparatus shown in FIG. 1 (and FIG. 2) is used to manufacture a carbon nanotube. Specific requirements for the individual constitution of the manufacturing apparatus are as follows.

Reaction container 10: A cylindrical container chamber made of stainless steel. 210 mm in diameter and 380 mm in length.

Electrode (cathode) 11: A cylindrical graphite rod with an outer diameter of 5 mm (purity: 99.9% or more).

Electrode (anode) 12: A cylindrical graphite rod with an outer diameter of 15 mm (purity: 99.9% or more).

Moving apparatus 13: Capable of moving the electrode 11 with a stepping motor. Adjusts to maintain the interval between the electrodes 11 and 12 constant during plasma discharge.

Power supply 18: A DC arc welding power supply (Osaka Denki AR-SB300) capable of controlling the current from 20 A to 300 A.

Permanent magnets 20 to 23: Cylindrical NdFB permanent magnets with a diameter of 22 mm and a thickness of 10 mm (Niroku Seisakusho).

Holder 41: A copper cylinder with a diameter of 30 mm and a length of 80 mm. The coolant circulating pipe through which water circulates is routed inside the holder so as to control the temperature at the tip of the electrode 11 within 300° C.

Holder 42: A copper cylinder with a diameter of 40 mm and a length of 120 mm. The coolant circulating pipe through which water circulates is routed inside the holder so as to control the temperature at the tip of the electrode 12 within 300° C.

Thermal shield wall 30: A cylindrical member made of copper. 28 mm in outer diameter, 22 mm in inner diameter, and 36 mm in length.

Tube (cooling pipe) 36: A ¼-inch pipe made of copper wound 5 times around the outer periphery of the thermal shield wall 30. Water cooling.

Figure 10:
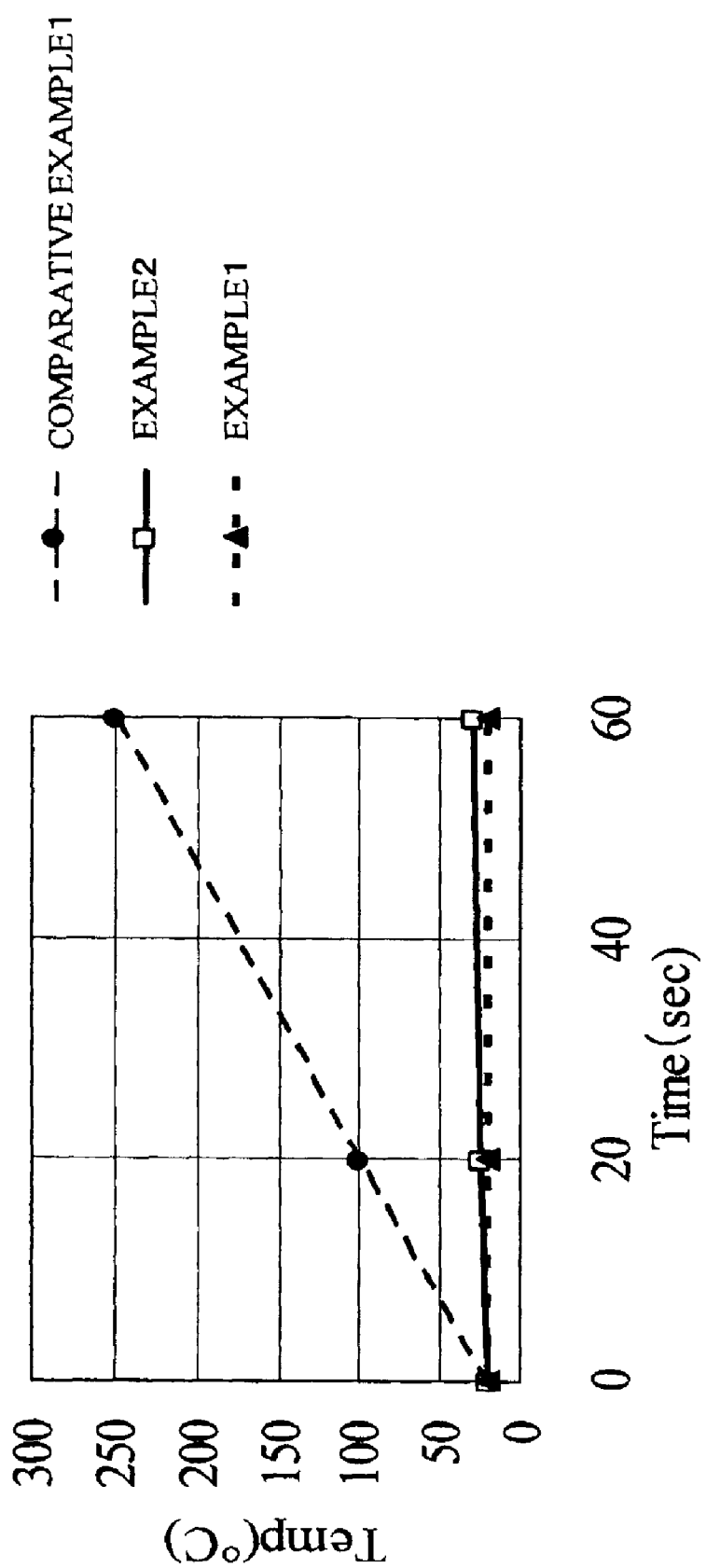
FIG. 10 is a graph showing temperature transition of a surface of a permanent magnet in operations according to examples and a comparative example of the present invention, the graph being plotted such that the abscissa axis represents discharge time and the ordinate axis represents a surface temperature of the permanent magnet.

The manufacturing apparatus described above was used to manufacture the carbon nanotube. The inside of the reaction container 10 was not decompressed, and the carbon nanotube was manufactured at 101.325 kPa (one atmospheric pressure). To generate arc discharge between the electrodes 11 and 12, the contact arc process was conducted first, and then, the electrodes 11 and 12 were spaced apart by 0.5 mm to 2 mm after the start of the discharge. The voltage applied by the power supply 18 is DC 18 V. The arc discharge was conducted under the conditions described above while 60 seconds was set as the discharge period. The current was 80 A. At this time, the surface thermometer is attached to the surface of the permanent magnet 21 on the side opposed to the electrode of the permanent magnet 21 in the manufacturing apparatus, and the temperature transition of the surface of the permanent magnet 21 was checked from the start to end of the discharge operation. The results are shown in the graph of FIG. 10. Also, the graph is examined below in the section <Checking of Thermal Shielding Efficiency>.

After discharging, the electrode 11 was taken out, and the tip thereof was observed by the scanning electron microscope in the same manner as in Example 1. As a result of the observation using the scanning electron microscope, it was confirmed that high purity (approximately 95%) carbon nanotubes were generated.

Comparative Example 1

A manufacturing apparatus according to Comparative Example 1 has the same structure as that of Example 2 including positional relationships of the respective members, except that the thermal shield wall 30 and the tube 36 as the cooling unit are removed from the manufacturing apparatus. That is, in this comparative example, a member functioning as the thermal shield wall is not included. The manufacturing apparatus was used to manufacture a carbon nanotube under the same conditions as in Example 1. At this time, the surface thermometer is attached to the surface of the permanent magnet 21 on the side opposed to the electrode of the permanent magnet 21 in the manufacturing apparatus, and the temperature transition of the surface of the permanent magnet 21 was checked from the start to end of the discharge operation. The results are shown in the graph of FIG. 10. Also, the graph is examined below in the section <Checking of Thermal Shielding Efficiency>.

After discharging, the electrode 11 was taken out, and the tip thereof was observed by the scanning electron microscope in the same manner as in Example 1. As a result of the observation using the scanning electron microscope, it was confirmed that a carbon nanotube was generated but the purity thereof was reduced (by approximately 30 to 40%) carbon nanotubes were generated.

<Checking of Thermal Shielding Efficiency>

By checking the temperature transition of the surface of the permanent magnet in the above-mentioned operations according to Examples 1 and 2 and Comparative Example 1, the thermal shielding efficiency of the thermal shield wall was checked. The results are shown in the graph of FIG. 10. The graph of FIG. 10 is plotted such that the abscissa axis represents discharge time and the ordinate axis represents the surface temperature of the permanent magnet. As is apparent from the graph, both in Example 1 in which the permanent magnet is placed outside the reaction container 50 serving as the thermal shield wall and in Example 2 in which the thermal shield wall (thermal shield wall 30) having a cylindrical shape is provided, the rise in temperature of the permanent magnet is hardly observed, and it is confirmed that the thermal demagnetization of the magnets and the magnetic field annihilation are effectively prevented.

As has been described above, according to the present invention, the manufacturing apparatus for a carbon nanotube can be provided, which can suppress the influence on the magnetic field due to the heat generated from the discharge plasma in the art for forming the predetermined magnetic field in the generation area of the discharge plasma typified by the arc discharge, and can stably manufacture a high-purity carbon nanotube with excellent industrial efficiency.

What is claimed is:

1. A manufacturing apparatus for a carbon nanotube, comprising:
   at least two electrodes whose tips are opposed to each other;
   at least a power supply that applies a voltage between the two electrodes to generate discharge plasma in a discharge area between the two electrodes; and
   at least a plurality of magnets that generates, in a generation area of the discharge plasma, at least one of a magnetic field of multiple directions and a magnetic field having a component in parallel with a flowing direction of a discharge current,
   wherein a thermal shield wall made of a non-magnetic material is disposed between the magnets and the generation area of the discharge plasma.

2. A manufacturing apparatus for a carbon nanotube according to claim 1, wherein the thermal shield wall includes a cooling unit.

3. A manufacturing apparatus for a carbon nanotube according to claim 1, wherein at least the two electrodes and the generation area of the discharge plasma are received in one container.

4. A manufacturing apparatus for a carbon nanotube according to claim 3, wherein a part of the container serves as the thermal shield wall.

5. A manufacturing apparatus for a carbon nanotube according to claim 3, wherein the container is a sealed container.

6. A manufacturing apparatus for a carbon nanotube according to claim 5, further comprising an atmosphere adjusting unit for adjusting at least one of a pressure and a kind of gas of an atmosphere inside the sealed container.

7. A manufacturing apparatus for a carbon nanotube according to claim 5, wherein the discharge plasma generated in the discharge area is arc plasma.

8. A manufacturing apparatus for a carbon nanotube according to claim 1, wherein the plurality of magnets is selected from the group consisting of permanent magnets and electromagnets arranged along the flowing direction of the discharge current so as to surround at least one of the generation area of the discharge plasma and an area close to the generation area, and wherein each of the plurality of magnets is arranged to direct the same pole toward the discharge area.

9. A manufacturing apparatus for a carbon nanotube according to claim 1, wherein the plurality of magnets includes even number of magnets, equal to or greater than four, selected from the group consisting of permanent magnets and electromagnets arranged along the flowing direction of the discharge current so as to surround at least one of the generation area of the discharge plasma and an area close to the generation area, and wherein each of the plurality of magnets is arranged to have a pole opposite to that of the adjacent magnet directed toward the discharge area.

10. A manufacturing apparatus for a carbon nanotube according to claim 1, wherein the magnets are formed of one or two coils whose center axis is approximately aligned to the flowing direction of the discharge current.

11. A manufacturing apparatus for a carbon nanotube according to claim 1, wherein, of the two electrodes whose tips are opposed to each other, a magnetic flux density at an edge of the tip of the electrode that generates the discharge plasma is in a range from $10^{-5}$ T to 1 T.

12. A manufacturing apparatus for a carbon nanotube according to claim 1, wherein a density of the discharge current at the time of generating the discharge plasma is in a range from 0.05 A/mm$^2$ to 15 A/mm$^2$ with respect to an area of the tip of the electrode that generates the discharge plasma.

13. A manufacturing apparatus for a carbon nanotube according to claim 1, wherein the voltage applied to the electrodes by the power supply is in a range from 1 V to 30 V.

14. A manufacturing apparatus for a carbon nanotube according to claim 1, wherein the voltage applied to the electrodes by the power supply is a DC voltage.

15. A manufacturing apparatus for a carbon nanotube according to claim 1, wherein the voltage applied to the electrodes by the power supply is a DC voltage, and wherein an area of a tip of a cathode of the two electrodes whose tips are opposed to each other is equal to or less than an area of a tip of an anode of the two electrodes.

16. A manufacturing apparatus for a carbon nanotube according to claim 1, wherein a material of the electrodes is one of carbon and a material that contains carbon and has an electric resistivity in a range from 0.01 Ω·cm to 10 Ω·cm.

* * * * *